(12) United States Patent
Yuan et al.

(10) Patent No.: US 7,940,588 B2
(45) Date of Patent: May 10, 2011

(54) CHIP TESTING CIRCUIT

(75) Inventors: Der-Min Yuan, Taipei County (TW); Ming-Cheng Liang, Hsin Chu County (TW); Kuo-Hua Lee, Hsin Chu (TW)

(73) Assignee: Etron Technology, Inc., Hsin Chu (TW)

( * ) Notice: Subject to any disclaimer, the term of this patent is extended or adjusted under 35 U.S.C. 154(b) by 138 days.

(21) Appl. No.: 12/548,828

(22) Filed: Aug. 27, 2009

(65) Prior Publication Data

US 2010/0171509 A1 Jul. 8, 2010

(30) Foreign Application Priority Data

Jan. 7, 2009 (TW) .............................. 98100290 A

(51) Int. Cl.
*G11C 7/00* (2006.01)

(52) U.S. Cl. .................... 365/201; 365/189.02; 324/537

(58) Field of Classification Search ................... None
See application file for complete search history.

(56) References Cited

U.S. PATENT DOCUMENTS

| 5,862,146 | A  | * | 1/1999  | Chen et al. ............... 714/718 |
| 6,038,182 | A  | * | 3/2000  | Hwang ..................... 365/201 |
| 6,134,161 | A  | * | 10/2000 | Taniguchi et al. ........... 365/201 |
| 6,515,922 | B1 | * | 2/2003  | Yamagata .................. 365/201 |
| 7,562,269 | B2 | * | 7/2009  | Yoshida et al. ............. 714/719 |
| 2006/0256631 | A1 | * | 11/2006 | Nobunaga et al. .......... 365/201 |

* cited by examiner

*Primary Examiner* — Hoai V Ho
*Assistant Examiner* — James G Norman
(74) *Attorney, Agent, or Firm* — Muncy, Geissler, Olds & Lowe, PLLC

(57) ABSTRACT

The invention discloses a chip testing circuit that increases the testing throughput. The chip testing circuit uses a multiplexer to switch the connection of the data compressing circuit between data compressing base units which compress 4 XIOs, so as to obtain a multiplexer of testing data by one single interface circuit and to increase the testing throughput.

20 Claims, 5 Drawing Sheets

CHIP TESTING CIRCUIT

BACKGROUND OF THE INVENTION (a) Field of the Invention

The present invention relates to a chip testing circuit, and more particularly, to a chip testing circuit that increases the testing throughput.

(b) Description of the Related Art

Because of the small size and the powerful functionalities of an integrated circuit (IC), the integrated circuit has become one of the indispensable electronic components of the information technology related equipments. In order to make sure that the chips are working normally, all the chips must go through rigorous testing before shipped out of the factory. For example, a simple testing method inputs a known test signal into the circuit of the chip and then retrieves the cell signal from the circuit of the chip to determine whether the function of the chip is normal or not.

FIG. 1A shows a schematic diagram illustrating the write portion of a chip testing circuit 100 in the prior art. The write portion of the chip testing circuit 100 is coupled to the chip testing system (such as a probe card) via the first interface circuit 11 to receive the test signal TS outputted by the chip testing system and to transmit the test signal TS to the write unit 12. The write unit 12 is coupled to a DRAM cell array 1001 of the chip for inputting the test signal TS to the DRAM cell array 1001 of the chip. In order to increase testing efficiency, the first interface circuit 11 is coupled to a plurality of write units 12 so that the first interface circuit 11 can simultaneously input the testing signal TS into the write units 12 of the same write group 12a.

FIG. 1B shows a schematic diagram illustrating the read portion of a chip testing circuit 100 in the prior art. The read unit 22 receives the cell signal FS transmitted from the DRAM cell array 1001 of the chip and transmits the cell signal to the second interface circuit 21. On the other hand, the read units 22 of the same read compressing group 22a transmit the cell signal FS to the compressing circuit 23 for compression in order to generate a compressing signal CS. The compressing signal CS is then transmitted to the second interface circuit 21. The second interface circuit 21 then generates a determining signal DS according to the statuses of a cell signal FS and the compressing signal CS and transmits the determining signal to the chip testing system. Thus, the chip testing system can confirm whether the DRAM cell array 1001 of the chip is normal or not according to the determining signal DS.

As shown in FIG. 1B, each second interface circuit 21 can access the testing results of the four circuits of the chip that are coupled to the read units 22. This is the traditional four-terminal input/output signal compressing method (IO compress4 method) commonly used in the industry. However, according to the above-mentioned traditional architecture of the chip testing circuit, two dedicated pins must be utilized to couple the two first interface circuits 11 and the two second interface circuits 21 to the two probes of the chip testing system for correctly testing the chip. Therefore, the number of pins for testing will be increased and the testing cost for the chip will be increased as well. In order to increase the testing speed, more probes have to be used and the overall production cost is further increased.

BRIEF SUMMARY OF THE INVENTION

One object of the invention is to provide a chip testing circuit (a data compressing chip testing multiplexing circuit), and more particularly, to provide a chip testing circuit that increases the testing throughput and reduces the production cost.

In order to achieve the above-mentioned purpose, one embodiment of the invention provides a chip testing circuit. The chip testing circuit comprises a plurality of write units, a first interface circuit, a first switch, a plurality of read units, a first compressing circuit, a second compressing circuit, a second interface circuit, a first multiplexer, and a second multiplexer.

Each of the write units is coupled to at least one memory cell array (or internal circuit) of the chip and the write units are divided into a first write group and a second write group. The first interface circuit is coupled to the write units for receiving a test signal and transmitting the test signal to the write units to input the test signal into the memory cell array of the chip. The first switch is disposed between the first write group and the second write group for selectively coupling the first write group and the second write group.

Each of the read units is coupled to at least one memory cell array of the chip for receiving the cell signal from the circuit of the chip. The read units are divided into a first group of read units and a second group of read units. The first compressing circuit is coupled to the read units of the first group of read units for compressing the cell signals outputted from the read units to generate a first compressing signal. The second compressing circuit is coupled to the read units of the second group of read units for compressing the cell signals outputted from the read units to generate a second compressing signal. The second interface circuit generates a first determining signal according to the cell signals outputted from the first group of read units and the first compressing signal, or generates a second determining signal according to the cell signals outputted from the second group of read units and the second compressing signal. The first multiplexer is disposed among the second interface circuit, the first group of read units, and the second group of read units for selectively coupling the second interface circuit to the first group of read units or the second group of read units. The second multiplexer is disposed among the second interface circuit, the first compressing circuit, and the second compressing circuit for selectively coupling the second interface circuit to the first compressing circuit or the second compressing circuit.

Another embodiment of the invention provides a chip testing circuit comprising a first write group, a second write group, a first interface circuit, and a first switch. The first write group comprises a plurality of write units. The second write group also comprises a plurality of write units. The first interface circuit is electrically coupled to the plurality of write units of the first write group constantly. The first switch is disposed between the first write group and the second write group and selectively electrically couples the write units of the second write group to the first interface circuit. Thus, when the first interface circuit receives a test signal, the first interface circuit simultaneously transmits the test signal to the write units of the first write group and the write units of the second write group.

One other embodiment of the invention provides a chip testing circuit comprising a first group of read units, a first compressing circuit, a second group of read units, a second compressing circuit, a first selecting circuit, a second selecting circuit, and a second interface circuit. The first group of read units is to read a first group of cell signals from the chip. The first group of read units includes a first read unit for reading a first cell signal from the chip. The first compressing circuit is electrically coupled to the first group of read units and generates a first compressing signal according to the first group of cell signals. The second group of read units is to read a second group of cell signals from the chip. The second group of read units includes a second read unit for reading a second cell signal from the chip. The second compressing circuit is electrically coupled to the second group of read units and generates a second compressing signal according to the second group of cell signals. The first selecting circuit is electrically coupled to the first read unit and the second read unit and the first selecting circuit selectively outputs the first cell signal or the second cell signal to thereby generate a first output signal. The second selecting circuit is electrically coupled to the first compressing circuit and the second compressing circuit and the second selecting circuit selectively outputs the first compressing signal or the second compressing signal to thereby generate a second output signal. The second interface circuit is electrically coupled to the first selecting circuit and the second selecting circuit and the second interface circuit determines whether the chip is defective or not according to the first output signal and the second output signal.

Another embodiment of the invention provides a chip testing circuit comprising a first compressing circuit, a second compressing circuit, a first selecting circuit, a second selecting circuit, and a second interface circuit. The first compressing circuit generates a first compressing signal according to a first group of cell signals outputted from the chip wherein the first group of cell signals includes a first cell signal. The second compressing circuit generates a second compressing signal according to a second group of cell signals outputted from the chip wherein the second group of cell signals includes a second cell signal. The first selecting circuit selectively outputs the first cell signal or the second cell signal for generating a first output signal. The second selecting circuit selectively outputs the first compressing signal or the second compressing signal for generating a second output signal. The second interface circuit is electrically coupled to the first selecting circuit and the second selecting circuit and the second interface circuit determines whether the chip is defective or not according to the first output signal and the second output signal.

The chip testing circuit according to the embodiments of the invention utilizes the selecting circuit (or the first and the second multiplexers) for switching so that a single second interface circuit can acquire the test data of N groups (N is a positive integer and is less than infinite) of memory cell arrays of the chip. Therefore, the chip testing circuit according to the embodiments of the invention can effectively increase the testing throughput per time unit without increasing the number of the interface circuits and the number of pins. The production cost is reduced and the testing efficiency is increased.

DETAILED DESCRIPTION OF THE INVENTION

Detail descriptions of the chip testing circuit of the invention will be given herein with reference to the drawings in which one element is represented by the same symbol.

Figure 1A:
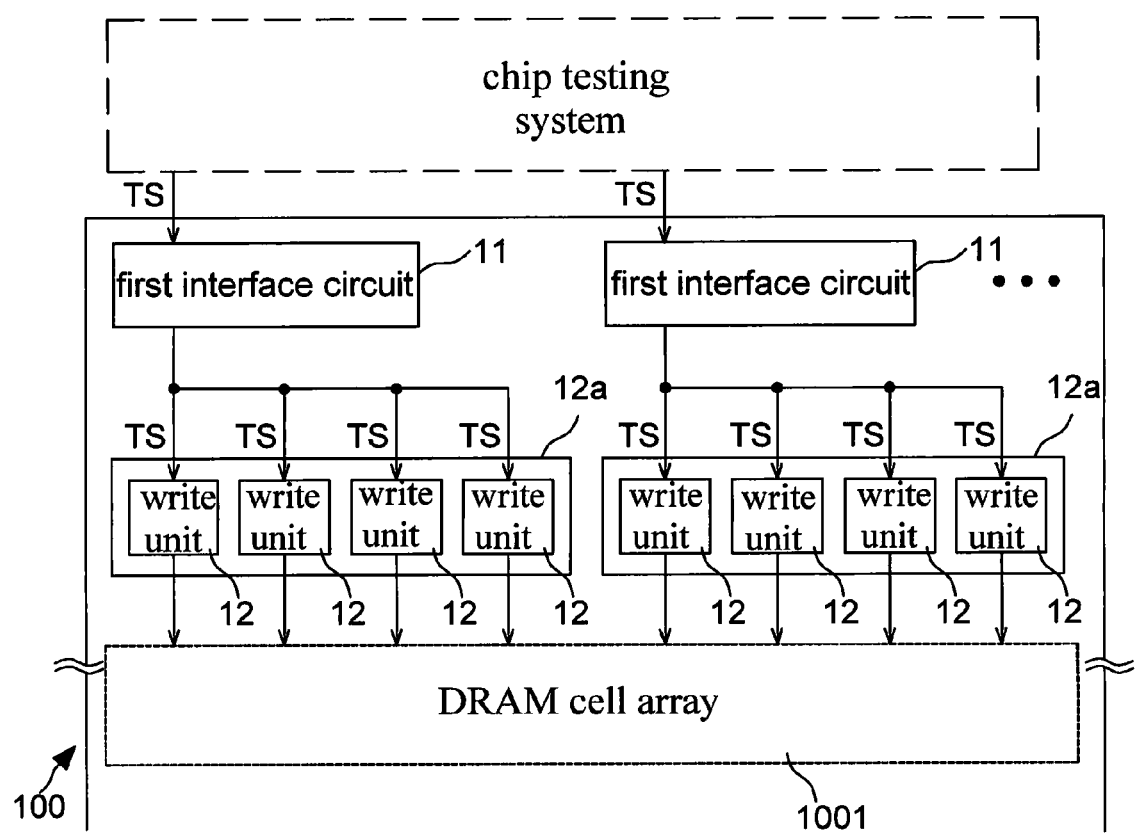
FIG. 1A shows a schematic diagram illustrating the write circuit of a chip testing circuit in the prior art.
Figure 1B:
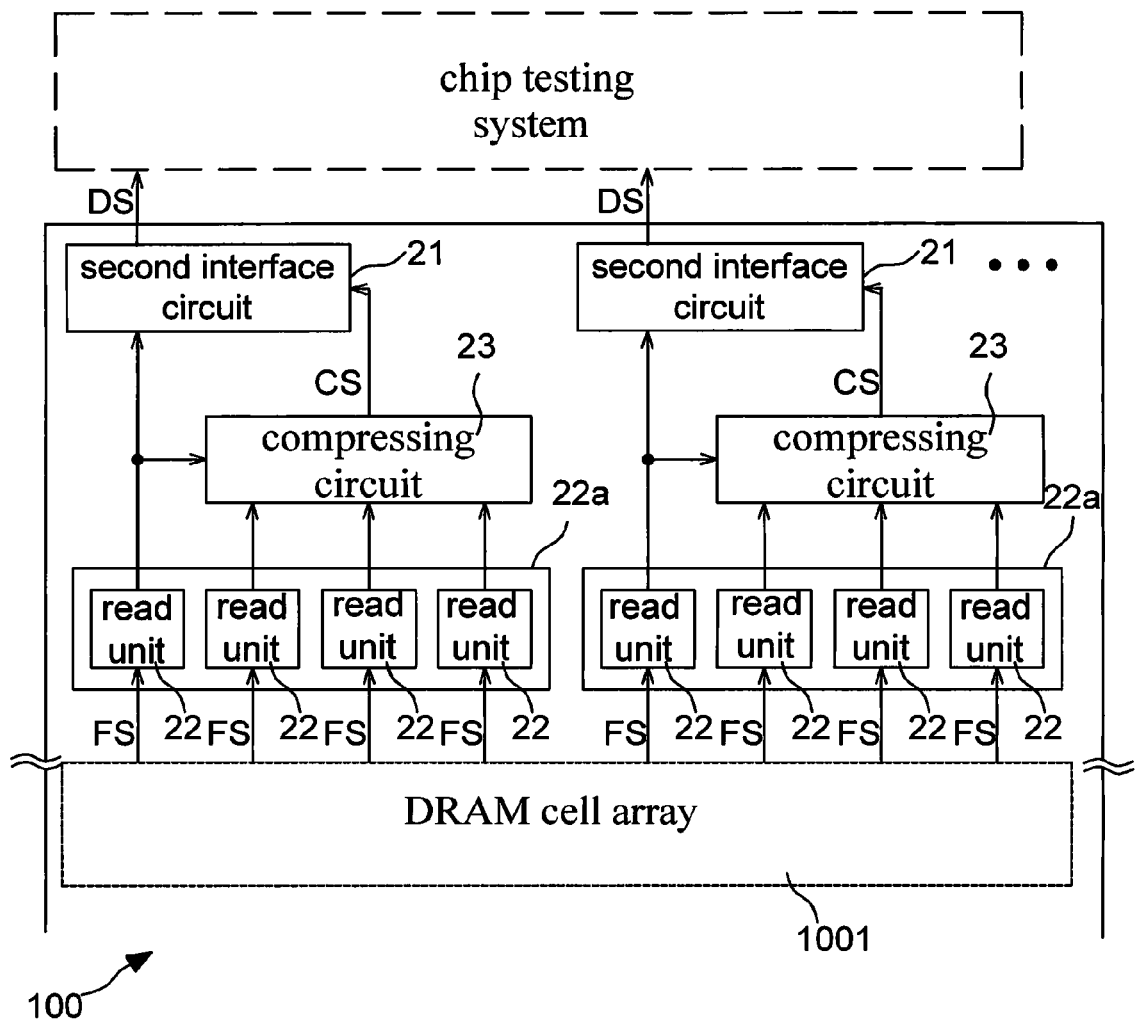
FIG. 1B shows a schematic diagram illustrating the read circuit of a chip testing circuit in the prior art.
Figure 2A:
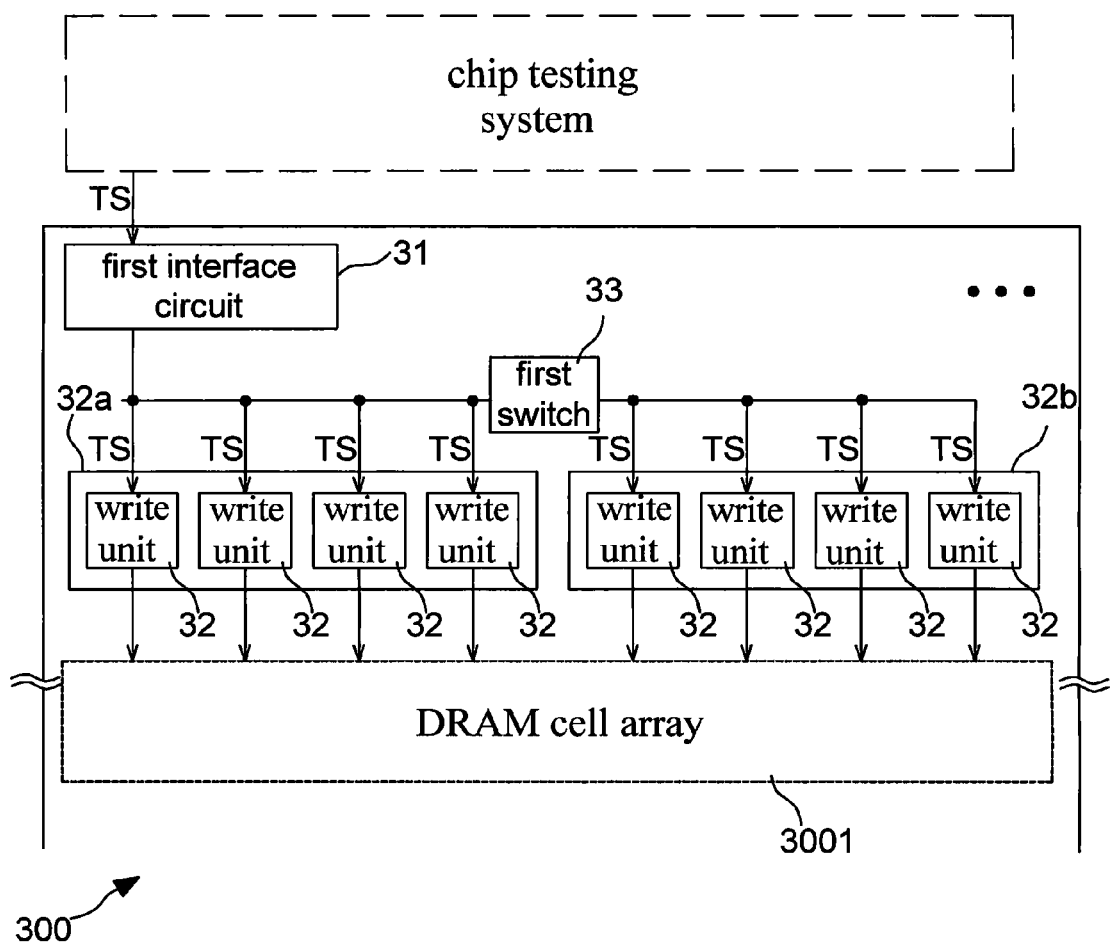
FIG. 2A shows a schematic diagram illustrating the write circuit of a chip testing circuit according to one embodiment of the invention.
Figure 2B:
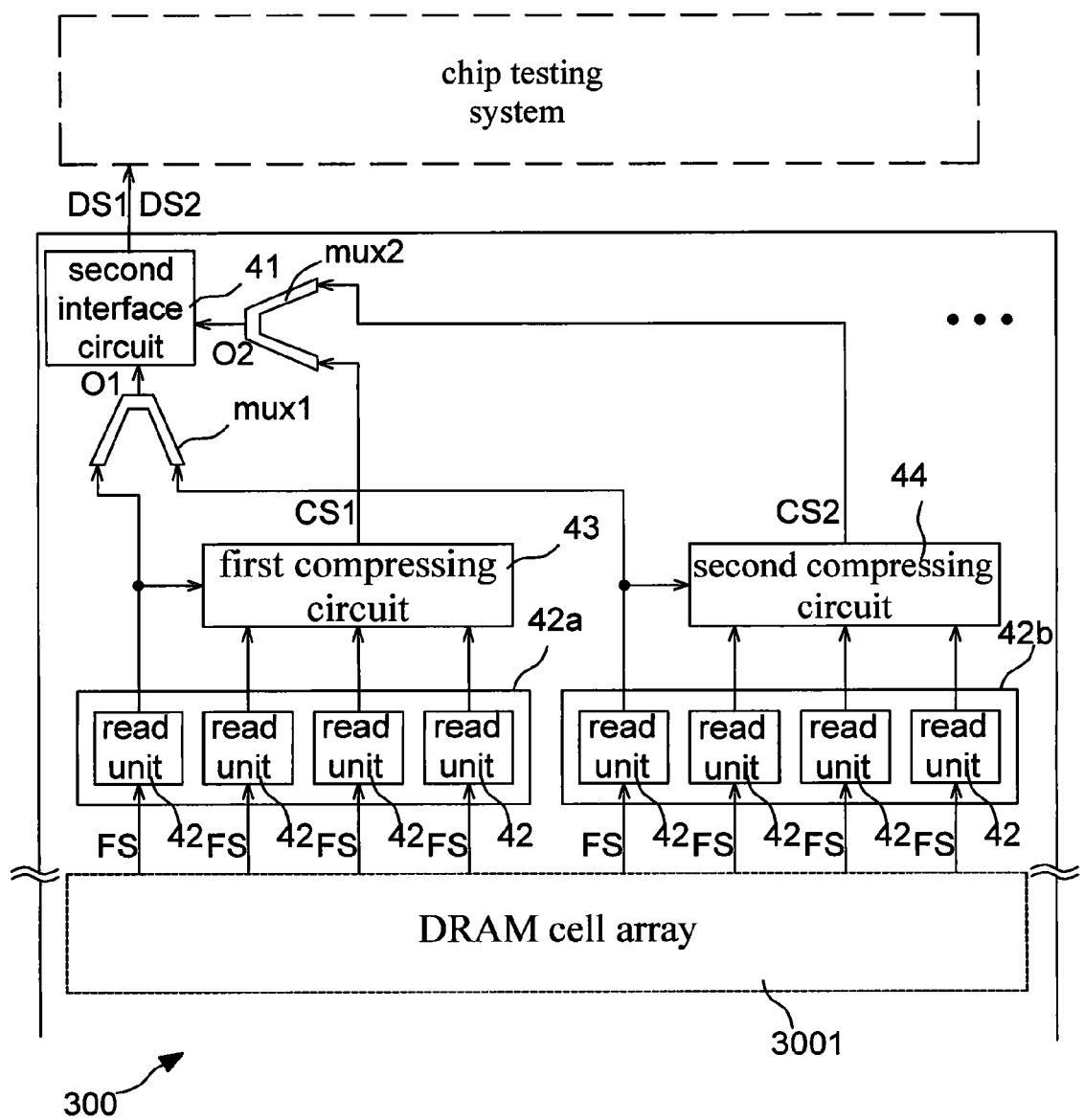
FIG. 2B shows a schematic diagram illustrating the read circuit of a chip testing circuit according to one embodiment of the invention.

FIGS. 2A and 2B show schematic diagrams illustrating the chip testing circuit according to one embodiment of the invention. The chip testing circuit 300 according to one embodiment of the invention comprises the write circuit portion (as shown in FIG. 2A) for inputting the test signal TS to the DRAM cell array (or internal circuit) 3001 of the chip and the read circuit portion (as shown in FIG. 2B) for acquiring the cell signal FS from the DRAM cell array 3001 of the chip.

As shown in FIG. 2A, the write circuit of the chip testing circuit 300 according to one embodiment of the invention comprises a plurality of write units 32, a first interface circuit 31, and a first switch 33.

Each write unit 32 is coupled to at least one DRAM cell array of the chip. For example, the chip can be a memory component, a memory-containing semiconductor device, or a logic component in a form of a wafer, a bare die, or a packaged chip. The write units 32 according to one embodiment of the invention can be part of the DRAM cell array 3001 of the chip. For example, in the memory component, the write units 32 may operate with the word driver for writing the test data into the specific address of the memory unit. The write units 32 can be divided into a first write group 32a and a second write group 32b.

The first interface circuit 31 is coupled to the plurality of write units 32. In one embodiment, the first interface circuit 31 can be electrically coupled (or constantly electrically coupled) to the write units 32 of the first write group 32a. The first interface circuit 31 can receive the test signal TS inputted from the chip testing system (such as a probe card) and transmit the test signal TS to the write units 32 of the first write group 32a and the write units 32 of the second write group 32b simultaneously or via time-sharing for inputting the test signal TS to the DRAM cell array of the chip.

The first switch 33 is disposed between the first write group 32a and the second write group 32b. In one embodiment, the first switch 33 can selectively couple (or electrically couple) the first write group 32a and the second write group 32b according to a control signal. Or, the first switch 33 can selectively electrically couple the write units 32 of the second write group 32b to the first interface circuit 31 when the first interface 31 is constantly electrically coupled to the first write group 32a. In other words, the first interface circuit 31 can be separately coupled to the write units 32 of the first write group 32a or the second write group 32b. Or, the first interface circuit 31 can be simultaneously coupled to the first write group 32a and the second write group 32b.

It should be noted that the above-mentioned control signal can be a redundancy address signal.

As shown in FIG. 2B, the read circuit of the chip testing circuit 300 according to one embodiment of the invention comprises a plurality of read units 42, a first compressing circuit 43, a second compressing circuit 44, a second interface circuit 41, a first multiplexer mux1, and a second multiplexer mux2.

The plurality of read units 42 are coupled to the DRAM cell array of the chip for receiving the cell signal FS transmitted from the DRAM cell array of the chip. The plurality of read units 42 can be divided into a first group of read units 42a and a second group of read units 42b. In one embodiment, the read units 42 can be part of the DRAM cell array 3001 of the chip. For example, in the memory component, the read units 42 may operate with the sense amplifier for reading the test data stored in the specific address of the memory unit.

The first compressing circuit 43 is coupled to (or electrically coupled to) the read units 42 of the first group of read units 42a for receiving the cell signal FS outputted from the read units 42 of the chip and compressing the cell signal FS to generate a first compressing signal CS1. The second compressing circuit 44 is coupled to (or electrically coupled to) the read units 42 of the second group of read units 42b for compressing the cell signal FS outputted from the read units 42 to generate a second compressing signal CS2. In one embodiment, the first compressing circuit 43 and the second compressing circuit 44 can be exclusive-OR (XOR) circuits. For the case of the first compressing circuit 43, the first compressing signal CS1 is a first voltage signal (such as a low voltage signal Low) when the contents of the plurality of cell signals FS transmitted from the plurality of read units 42 of the first group of read unit 42a are the same. On the other hand, the first compressing signal CS1 is a second voltage signal (such as a high voltage signal High) when the contents of the plurality of cell signals FS transmitted from the plurality of read units 42 are not the same.

The first multiplexer mux1 can be of various existing selecting circuits or future selecting circuits to be developed and is disposed among the second interface circuit 41, the first group of read units 42a, and the second group of read units 42b. The first multiplexer mux1 can be selectively coupled to (or electrically coupled to) the read units 42 of the first group of read units 42a or the second group of read units 42b. Thus, the second interface circuit 41 can selectively output the cell signal FS transmitted from the read units 42 of the first group of read units 42a or the second group of read units 42b for generating a first output signal O1. The second multiplexer mux2 can be of various existing selecting circuits or future selecting circuits to be developed and is disposed among the second interface circuit 41, the first compressing circuit 43, and the second compressing circuit 44. The second multiplexer mux2 can be selectively coupled to the first compressing circuit 43 or the second compressing circuit 44 for selectively outputting the first compressing signal CS1 and the second compressing signal CS2 transmitted from the first compressing circuit 43 and the second compressing circuit 44 to thereby generate a second output signal O2.

The second interface circuit 41 is coupled to (or electrically coupled to) the first multiplexer mux1 and the second multiplexer mux2 according to the first output signal O1 and the second output signal O2 to generate the first determining signal DS1 and the second determining signal DS2 for determining whether the DRAM cell array 3001 of the chip is defective or not.

In one embodiment, the first interface circuit 31 and the second interface circuit 41 can be the same interface circuit, that is, one interface circuit performs the functions of the first interface circuit 31 and the second interface circuit 41 at the same time. Obviously, in another embodiment, the first interface circuit 31 and the second interface circuit 41 can be two different interface circuits. During testing, the additional redundancy address of the chip testing system, such as the row address A11 of the probe card, can be utilized to transmit the control signal to the first switch 33, the first multiplexer mux1, and the second multiplexer mux2 for controlling the operations of the switch and the multiplexers.

For example, as shown in FIG. 2A, for the write portion, the chip testing system firstly inputs the test signal TS to the write circuit of the chip testing circuit 300. The first interface circuit 31 receives the test signal TS while the chip testing system provides a control signal to the first switch 33 via the redundancy address for coupling the first and the second write groups 32a, 32b. Then, the write units 32 of the two write groups 32a, 32b receive the test signal TS and transmit the test signal TS to the DRAM cell array 3001 of the chip.

As shown in FIG. 2B, for the read portion, the first multiplexer mux1 firstly couples the second interface circuit 41 to the first group of read units 42a according to a control signal provided by chip testing system via the redundancy address. Then, the second multiplexer mux2 also couples the second interface circuit 41 to the first compressing circuit 43 according to the control signal. The second interface circuit 41 then generates a first determining signal DS1 according to the cell signal FS outputted from the read units 42 of the first group of read units 42a and the first compressing signal CS1. In one embodiment, the first determining signal DS1 outputted from the second interface circuit 41 is the cell signal FS of the read unit 42 when the first compressing signal CS1 is a low voltage signal Low. When the first compressing signal CS1 is a high voltage signal High, the first determining signal DS1 outputted from the second interface circuit 41 is a Hi-Z signal, that is, the output terminal of the second interface circuit 41 is in a high impedance state. The chip testing system receives the first determining signal DS1 and determines the status of the DRAM cell array 3001 of the chip that is coupled to the first group of read units 42a according to the first determining signal DS1.

Thereafter, the first multiplexer mux1 couples the second interface circuit 41 to the read units 42 of the second group of read units 42b according to a control signal provided by chip testing system via the redundancy address. Then, the second multiplexer mux2 also couples the second interface circuit 41 to the second compressing circuit 44 according to the control signal. The second interface circuit 41 then generates a second determining signal DS2 according to the cell signal FS outputted from the read units 42 of the second group of read units 42b and the second compressing signal CS2. The chip testing system receives the second determining signal DS2 and determines the status of the DRAM cell array 3001 of the chip that is coupled to the second group of read units 42b according to the second determining signal DS2. It should be noted that various modifications or changes regarding the method of how the chip testing system determines the status of the DRAM cell array 3001 of the chip according to the determining signal DS2 can be performed by those who are skilled in the art according to the above-mentioned descriptions. Further details will not be repeated herein.

Thus, the chip testing system needs only one probe, that is, just a single contact is needed, when inputting the test signal TS and the determining signals DS1, DS2 to test whether the function of the chip is normal or not (or, determining whether the chip is defective or not). As the number of pins of the chip is reduced, the size and the cost of the chip are also reduced. And since fewer probes are used, the testing speed for a chip can be increased so that the overall production cost can be reduced. The problems of the prior art can thus be solved.

It should be noted that the first and the second write groups 32a, 32b of the chip testing circuit according to the above-mentioned embodiments of the invention comprise an equal number of the write units 32, that is, each comprises four write units 32. But, the invention is not limited to the above example. In one other embodiment of the invention, the first and the second write groups 32a, 32b can also comprise different numbers of the write units 32. Although the first and the second groups of read units 42a, 42b of the chip testing circuit according to the above-mentioned embodiments of the invention each comprise four read units 42. But, the invention is not limited to the above example. In one other embodiment of the invention, the first and the second group of read units 42a, 42b can also comprise different numbers of the read units 42. Furthermore, in one embodiment, the number of the write units 32 of the first write group 32a can be the same as the number of the read units 42 of the first group of read units 42a. However, in another embodiment, they can be different. Likewise, in one embodiment, the number of the write units 32 of the second write group 32b can be the same as the number of the read units 42 of the second group of read units 42b. However, they can be different in another embodiment of the invention.

The chip testing circuit according to the embodiments of the invention utilizes the first switch 33, the first multiplexer mux1, and the second multiplexer mux2 to perform switching so that a single second interface circuit can acquire the test data of N groups (N is a positive integer and is less than infinite) of DRAM cell arrays of the chip. For example, eight groups of data can be acquired according to the above-mentioned embodiments and such method is defined as the eight-terminal input/output signal compressing method (IO compress8 method). Therefore, the chip testing circuit according to the embodiments of the invention can effectively increase the testing throughput per time unit without increasing the number of the second interface circuit and the number of pins. Thus, the production cost is reduced and the testing efficiency is increased.

Figure 3:
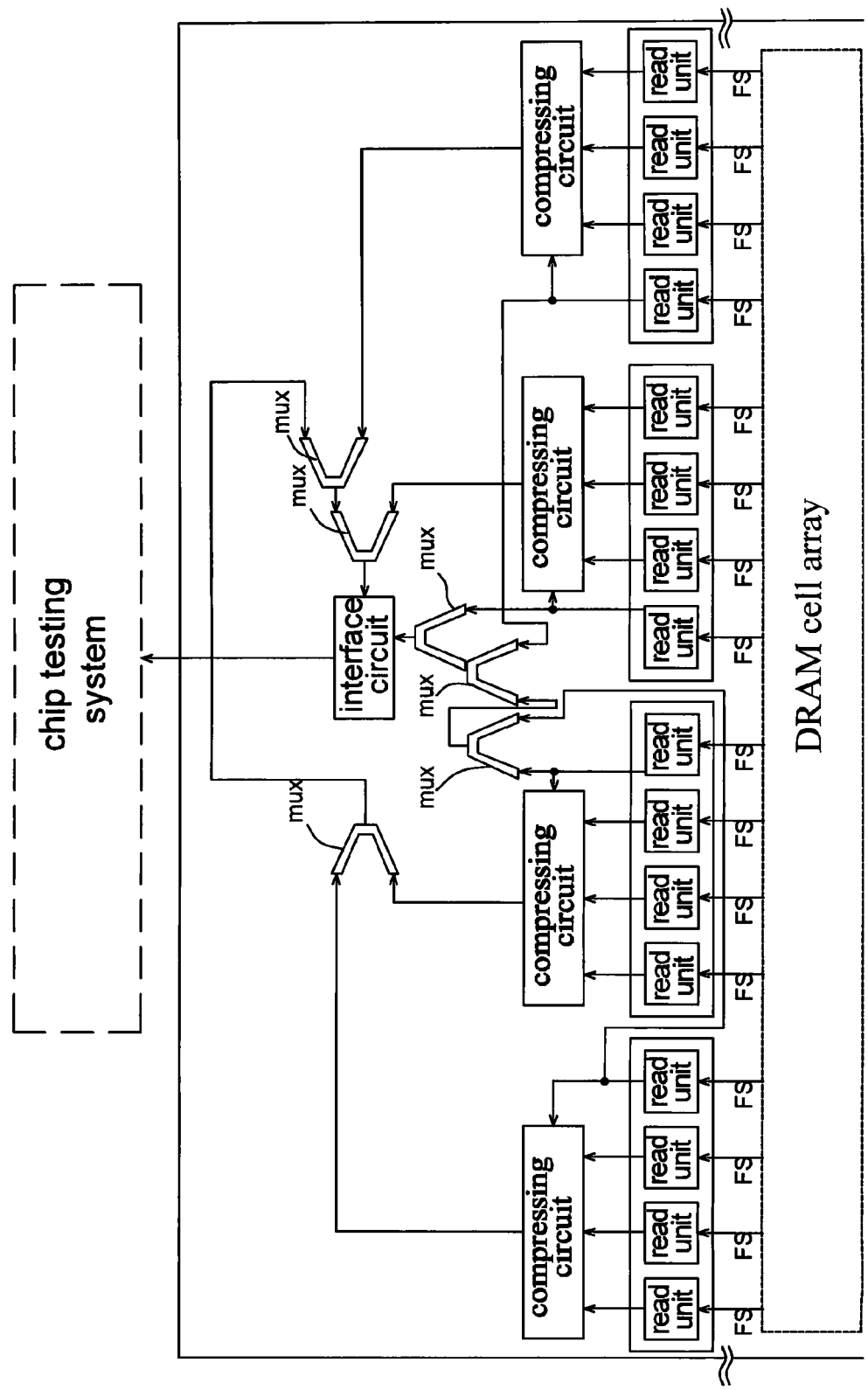
FIG. 3 shows a schematic diagram illustrating the read circuit of a chip testing circuit according to another embodiment of the invention.

It should be noted that various embodiments of the invention can be performed by those who are skilled in the art according to the above-mentioned descriptions. By the operations of the first switch 33, the first multiplexer mux1, and the second multiplexer mux2 according to the embodiments of the invention, the chip testing circuit can be backward compatible with the four-terminal input/output signal compressing method (IO compress4 method). Those who are skilled in the art can also understand that the chip testing circuit according to the embodiments of the invention is also compatible with the repair algorithm in the prior art and can be implemented accordingly. Likewise, it is also understood by those who are skilled in the art from the above-mentioned descriptions that the chip testing circuit according to the invention can also be upward developed to be the N-terminal (N is a positive integer and is less than infinite) input/output signal compressing method (IO compress N method). For example, a chip testing circuit utilizing sixteen-terminal input/output signal compressing method is shown in FIG. 3. The circuit of the read portion of the chip testing circuit is shown in the figure. By properly controlling the six multiplexers mux of the chip testing circuit, the cell signals FS from the read units of the four read compressing circuits are processed separately to determine the status of the DRAM cell array of the chip. Thus, the chip testing circuit utilizes only one interface circuit and one pin for being coupled to the probe of the chip testing system to achieve the effect of receiving sixteen cell signals. The chip testing efficiency is then increased and the cost of testing a chip is reduced.

Although the description of the invention is by way of above-mentioned examples of embodiment, it should not be construed as any limitation on the scope of the invention. Various modifications or changes can be performed by those who are skilled in the art without deviating from the scope of the invention.

What is claimed is:

1. A chip testing circuit, comprising:
    a plurality of write units coupled to at least one internal circuit of the chip and divided into a first write group and a second write group;
    a first interface circuit coupled to the plurality of write units for receiving a test signal and transmitting the test signal to the plurality of write units to input the test signal into the internal circuit of the chip;
    a first switch disposed between the first write group and the second write group for selectively coupling the first write group and the second write group;
    a plurality of read units coupled to at least one internal circuit of the chip for receiving cell signals from the circuit of the chip wherein the plurality of read units are divided into a first group of read units and a second group of read units;
    a first compressing circuit coupled to the plurality of read units of the first group of read units for compressing the cell signals outputted from the plurality of read units to generate a first compressing signal;
    a second compressing circuit coupled to the plurality of read units of the second group of read units for compressing the cell signals outputted from the plurality of read units to generate a second compressing signal;
    a second interface circuit for generating a first determining signal according to the cell signals outputted from the first group of read units and the first compressing signal, or for generating a second determining signal according to the cell signals outputted from the second group of read units and the second compressing signal;
    a first multiplexer disposed among the second interface circuit, the first group of read units, and the second group of read units for selectively coupling the second interface circuit to the first group of read units or the second group of read units; and
    a second multiplexer disposed among the second interface circuit, the first compressing circuit, and the second compressing circuit for selectively coupling the second interface circuit to the first compressing circuit or the second compressing circuit.

2. The chip testing circuit according to claim 1, wherein the first write group and the second write group comprise an equal number of the write units.

3. The chip testing circuit according to claim 1, wherein the first write group and the second write group each comprise four write units.

4. The chip testing circuit according to claim 1, wherein the first group of read units and the second group of read units comprise an equal number of the read units.

5. The chip testing circuit according to claim 1, wherein the first group of read units and the second group of read units each comprise four read units.

6. The chip testing circuit according to claim 1, wherein the number of the write units of the first write group equals the number of the read units of the first group of read units.

7. The chip testing circuit according to claim 1, wherein the number of the write units of the second write group equals the number of the read units of the second group of read units.

8. The chip testing circuit according to claim 1, wherein the chip is a memory component, a memory-containing semiconductor device, or a logic component.

9. The chip testing circuit according to claim 1, wherein the chip is in a wafer form, a bare die form, or a packaged chip form.

10. The chip testing circuit according to claim 1, being compatible with a repair algorithm.

11. A chip testing circuit, comprising:
- a first write group comprising a plurality of write units;
- a second write group comprising a plurality of write units;
- a first interface circuit electrically coupled to the plurality of write units of the first write group permanently; and
- a first switch being disposed between the first write group and the second write group and being selectively electrically coupling the plurality of write units of the second write group to the first interface circuit;
- wherein, when the first interface circuit receives a test signal, the first interface circuit transmits the test signal to the write units of the first write group and the write units of the second write group simultaneously.

12. The testing circuit for chip according to claim 11, wherein the first switch selectively electrically couples the write units of the second write group to the first interface circuit according to a control signal.

13. The testing circuit for chip according to claim 11, wherein the control signal is a redundancy address signal.

14. A chip testing circuit, comprising:
- a first group of read units for reading a first group of cell signals from the chip wherein the first group of read units includes a first read unit for reading a first cell signal from the chip;
- a first compressing circuit electrically coupled to the first group of read units for generating a first compressing signal according to the first group of cell signals;
- a second group of read units for reading a second group of cell signals from the chip wherein the second group of read units includes a second read unit for reading a second cell signal from the chip;
- a second compressing circuit electrically coupled to the second group of read units for generating a second compressing signal according to the second group of cell signals;
- a first selecting circuit electrically coupled to the first read unit and the second read unit for selectively outputting the first cell signal or the second cell signal to thereby generate a first output signal;
- a second selecting circuit electrically coupled between the first compressing circuit and the second compressing circuit wherein the second selecting circuit selectively outputs the first compressing signal or the second compressing signal to thereby generate a second output signal; and
- an interface circuit electrically coupled to the first selecting circuit and the second selecting circuit for determining whether the chip is defective or not according to the first output signal and the second output signal.

15. The testing circuit according to claim 14, wherein the first selecting circuit selectively outputs the first cell signal or the second cell signal according to a control signal.

16. The testing circuit according to claim 15, wherein the second selecting circuit selectively outputs the first compressing signal or the second compressing signal according to the control signal.

17. The testing circuit according to claim 16, wherein the control signal is a redundancy address signal.

18. A chip testing circuit, comprising:
- a first compressing circuit for generating a first compressing signal according to a first group of cell signals outputted from the chip wherein the first group of cell signals includes a first cell signal;
- a second compressing circuit for generating a second compressing signal according to a second group of cell signals outputted from the chip wherein the second group of cell signals includes a second cell signal;
- a first selecting circuit for selectively outputting the first cell signal or the second cell signal to generate a first output signal;
- a second selecting circuit for selectively outputting the first compressing signal or the second compressing signal to generate a second output signal; and
- a second interface circuit electrically coupled to the first selecting circuit and the second selecting circuit for determining whether the chip is defective or not according to the first output signal and the second output signal.

19. The testing circuit according to claim 18, wherein the first selecting circuit selectively outputs the first cell signal or the second cell signal according to a control signal and the second selecting circuit selectively outputs the first compressing signal or the second compressing signal according to the control signal.

20. The testing circuit according to claim 19, wherein the control signal is a redundancy address signal.

\* \* \* \* \*